United States Patent
Conte et al.

(10) Patent No.: US 7,551,041 B2
(45) Date of Patent: Jun. 23, 2009

(54) OSCILLATOR AND METHOD FOR OPERATING AN OSCILLATOR

(75) Inventors: Antonino Conte, Tremestieri Etneo (IT); Alberto Josè Di Martino, Syracuse (IT)

(73) Assignee: STMicroelectronics s.r.l., Agrate Brianza (MI) (IT)

(*) Notice: Subject to any disclaimer, the term of this patent is extended or adjusted under 35 U.S.C. 154(b) by 88 days.

(21) Appl. No.: 11/261,395

(22) Filed: Oct. 28, 2005

(65) Prior Publication Data

US 2006/0103477 A1    May 18, 2006

(30) Foreign Application Priority Data

Oct. 28, 2004    (IT)    ............ MI2004A2052

(51) Int. Cl.
*H03K 3/02*    (2006.01)
(52) U.S. Cl. .......................... 331/143; 331/111; 331/56
(58) Field of Classification Search .................. 331/45, 331/74, 111, 112, 143, 150, 152, 153, 185, 331/46, 56
See application file for complete search history.

(56) References Cited

U.S. PATENT DOCUMENTS

| | | | | |
|---|---|---|---|---|
| 3,831,113 | A | * | 8/1974 | Ahmed .................. 331/111 |
| 4,931,750 | A | * | 6/1990 | Gontowski ............. 331/111 |
| 6,052,035 | A | * | 4/2000 | Nolan et al. ............ 331/74 |

* cited by examiner

*Primary Examiner*—Robert Pascal
*Assistant Examiner*—Ryan J. Johnson
(74) *Attorney, Agent, or Firm*—Lisa K. Jorgenson; Stephen Bongini; Fleit Gibbons Gutman Bongini & Bianco P.L.

(57) ABSTRACT

An oscillator is provided that includes at least one capacitor, at least one comparator, and at least one device for charging or discharging the at least one capacitor. The capacitor is coupled to the comparator. The comparator compares the voltage on the capacitor with a reference voltage, and activates the device so as to command the charging or the discharging of the capacitor. The oscillator also comprises a circuit for supplying a preset voltage to the comparator when the device commands the charging of the capacitor, so that the comparator compares the reference voltage diminished by the preset voltage with the voltage on the capacitor, or the voltage on the capacitor added to the preset voltage with the reference voltage.

20 Claims, 4 Drawing Sheets

OSCILLATOR AND METHOD FOR OPERATING AN OSCILLATOR

CROSS-REFERENCE TO RELATED APPLICATIONS

This application is based upon and claims priority from prior Italian Patent Application No. MI2004A 002052, filed Oct. 28, 2004, the entire disclosure of which is herein incorporated by reference.

FIELD OF THE INVENTION

The present invention relates to oscillators and methods for operating oscillators.

BACKGROUND OF THE INVENTION

The circuit topology of oscillators generally used for generating a square wave is based on the constant-current charging of one or more capacitors between two levels of voltage. The oscillating frequency of this type of oscillator is set by the time that the capacitor takes to charge from one level of voltage to the other. That is, it is given by the ratio between the charging capacity of the capacitor and the charging current.

For these types of oscillators there are various methods for controlling the charging or discharging of the capacitor; amongst the most common are the method of controlling the transistor threshold voltage and the method of controlling through differential comparators.

With the first method a terminal of the capacitor is connected to the gate terminal of a MOS transistor whose task is to block the charging of the capacitor when it is on and to reactivate it when it is off. This control method is simple but it is strongly dependent on the temperature and on the process variables.

With the second method the output of a differential comparator that compares the voltage on the capacitor with a reference voltage is used to activate or deactivate the charging of the capacitor. This type of control is more complex but it is more stable. Further, its consumption increases with the frequency given that the correct functioning depends on the speed of response of the differential comparator.

FIG. 1 shows a constant-charge oscillator with a control device based on differential comparators. The oscillator comprises two capacitors C1 and C2 charged by a current I through two current mirrors QP1-QP3 and QP2-QP3 that are connected to the supply voltage Vcc. The first capacitor C1 has a terminal connected to ground and the other terminal connected to the non-inverting terminal of a first differential comparator Comp1 that has its inverting terminal connected to a reference voltage Vref1. The second capacitor C2 has a terminal connected to ground and the other terminal connected to the non-inverting terminal of a second differential comparator Comp2 that has its inverting terminal connected to the reference voltage Vref1. The outputs P1 and P2 of the comparators Comp1 and Comp2 respectively constitute the set input S and reset input R of a set-reset flip-flop FF1 whose outputs Q and Qneg are the drive voltages of two MOS transistors QN1 and QN2 having their drain terminals connected to the terminal of the capacitor C1 and the terminal of the capacitor C2, respectively. The voltage levels are ground and the reference voltage Vref1, and the half-period is given by the time taken by the voltage at the terminals of the capacitors C1 and C2 to go from ground to the reference voltage Vref1.

The comparators COMP1 and COMP2 generate the signals needed for controlling the charging and discharging of the capacitors C1 and C2. When the outputs of the flip-flop FF1 are Q=0 and Qneg=1, the transistor QN1 is off. In this way the capacitor C1 can charge itself with the current I supplied by the mirror QP1-QP3 while the transistor QN2 is on keeping the second capacitor C2 discharged and the voltage on the non-inverting terminal of the second comparator Comp2 at ground. The first capacitor C1 will charge until the voltage on the non-inverting terminal of the first comparator Comp1 reaches the reference voltage Vref1, making the output of the first comparator Comp1 switch from 0 to 1 and setting the outputs of the flip-flop FF1 at Q=1 and Qneg=0. In this way the transistor QN1 turns on rapidly discharging the first capacitor C1 and the transistor QN2 turns off enabling the charging of the second capacitor C2 with the current I supplied by the mirror QP2-QP3. The second capacitor C2 will charge until the voltage on the non-inverting terminal of the first comparator Comp1 reaches the reference voltage Vref1, making the first comparator COMP1 switch and bringing back the flip-flop FF1 to its starting state. In this way the charging and discharging cycle of the capacitors C1 and C2 is alternated. If the transistor QP1 and the first capacitor C1 are equal respectively to the transistor QP2 and to the second capacitor C2, a square wave with a duty-cycle of 50% will be generated at the output and supplied to the flip-flop FF1.

A serious limitation in frequency in the use of this type of oscillator is the switching speed of the comparators COMP1 and COMP2. FIG. 2 shows how the voltage Vcp evolves at the terminals of the two capacitors C1 and C2; actually the comparators do not switch when the voltage in the capacitors reaches the reference voltage Vref1 but a period of time Δt after due to the delay of the comparator. At high frequencies, when the period of time Δt is not negligible compared to the period of oscillation T, the working frequency of the oscillator cannot be set only by the current-capacity ratio in the capacitors but there must also be considered a variable Δt with the working conditions. In addition, at high frequency, a high speed of charging or discharging enables the transformation of the period of time Δt into a high variation of voltage ΔV, compromising the functioning of the oscillator at low supply voltages.

SUMMARY OF THE INVENTION

In view of the drawbacks described above, it is an object of the present invention to provide an oscillator that overcomes these drawbacks.

One embodiment of the present invention provides an oscillator that includes at least one capacitor, at least one comparator, and at least one device for charging or discharging the at least one capacitor. The capacitor is coupled to the comparator, which compares the voltage on the capacitor with a reference voltage and which activates the device for charging or discharging the capacitor. The oscillator also includes a circuit for supplying a preset voltage to the comparator when the device commands the charging of the capacitor, so that the comparator compares the reference voltage diminished by the preset voltage with the voltage on the capacitor, or the voltage on the capacitor added to the preset voltage with the reference voltage.

Another embodiment of the present invention provides a method for operating an oscillator that includes at least one capacitor, at least one comparator, and at least one device for charging or discharging the at least one capacitor. According to the method, in a first phase a reference voltage is supplied to the comparator, in a second phase the voltage on the capacitor is compared with the reference voltage, in a third phase the charging of the capacitor is commanded, and in another phase before the second phase a preset voltage is input to the comparator so that in the second phase the comparison is between the reference voltage diminished by the preset voltage and the voltage on the capacitor, or between the voltage on the capacitor added to the preset voltage and the reference voltage.

The present invention makes it is possible to produce an oscillator that achieves higher operation frequencies and allows the use of a lower supply voltage. In addition the oscillator is more stable with respect to the temperature variations and the variations of the supply voltage, and presents greater stability with respect to the process variables. The oscillator also presents lower consumption compared to known oscillators.

Other objects, features, and advantages of the present invention will become apparent from the following detailed description. It should be understood, however, that the detailed description and specific examples, while indicating preferred embodiments of the present invention, are given by way of illustration only and various modifications may naturally be performed without deviating from the present invention.

DETAILED DESCRIPTION OF PREFERRED EMBODIMENTS

Preferred embodiments of the present invention will be described in detail hereinbelow with reference to the attached drawings.

Figure 3:
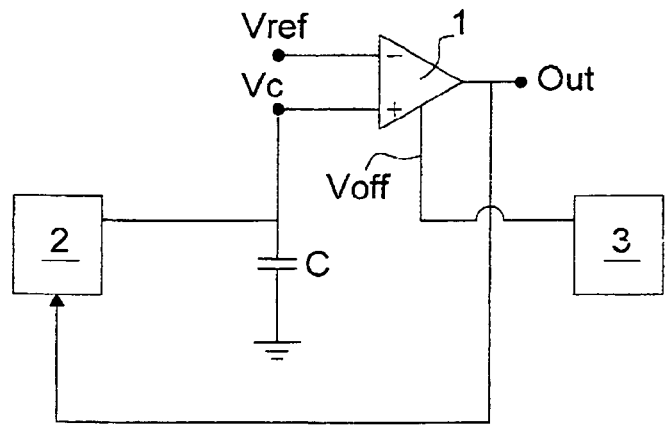
FIG. 3 is a block diagram of an oscillator according to a preferred embodiment of the present invention.

FIG. 3 shows a block diagram of an oscillator according to a preferred embodiment of the present invention. The oscillator comprises at least one capacitor C, at least one comparator 1, and at least one device 2 for charging or discharging the capacitor C. The capacitor C has a terminal connected to ground and a terminal connected to the non-inverting terminal of the comparator 1 whose inverting terminal receives a reference voltage Vref. The comparator 1 compares the voltage Vc on the capacitor C with the reference voltage and activates the device 2 so as to command the charging or discharging of the capacitor. More precisely, when the voltage Vc equals the reference voltage Vref the comparator 1 commands the device to discharge the capacitor C, while when the voltage Vc tends to zero the comparator commands the device to charge the capacitor C.

The oscillator also comprises a circuit 3 for supplying a preset voltage Voff to an input of the comparator 1 when the comparator itself commands the charging of the capacitor C. The comparator therefore compares a voltage given by the reference voltage Vref diminished by the preset voltage Voff with the voltage on the capacitor Vc or the voltage on the capacitor Vc added to the preset voltage Voff with the reference voltage Vref, in particular the voltage value Voff is proportional to the period of time Δt which the comparator 1 used for switching. In this way the comparator anticipates the switching of the period of time Δt.

The circuit 3 is coupled to the capacitor C so as to automatically generate the voltage value Voff; the circuit 3 takes the final value of the voltage on the capacitor C and determines the voltage value Voff on the basis of this value.

Figure 4:
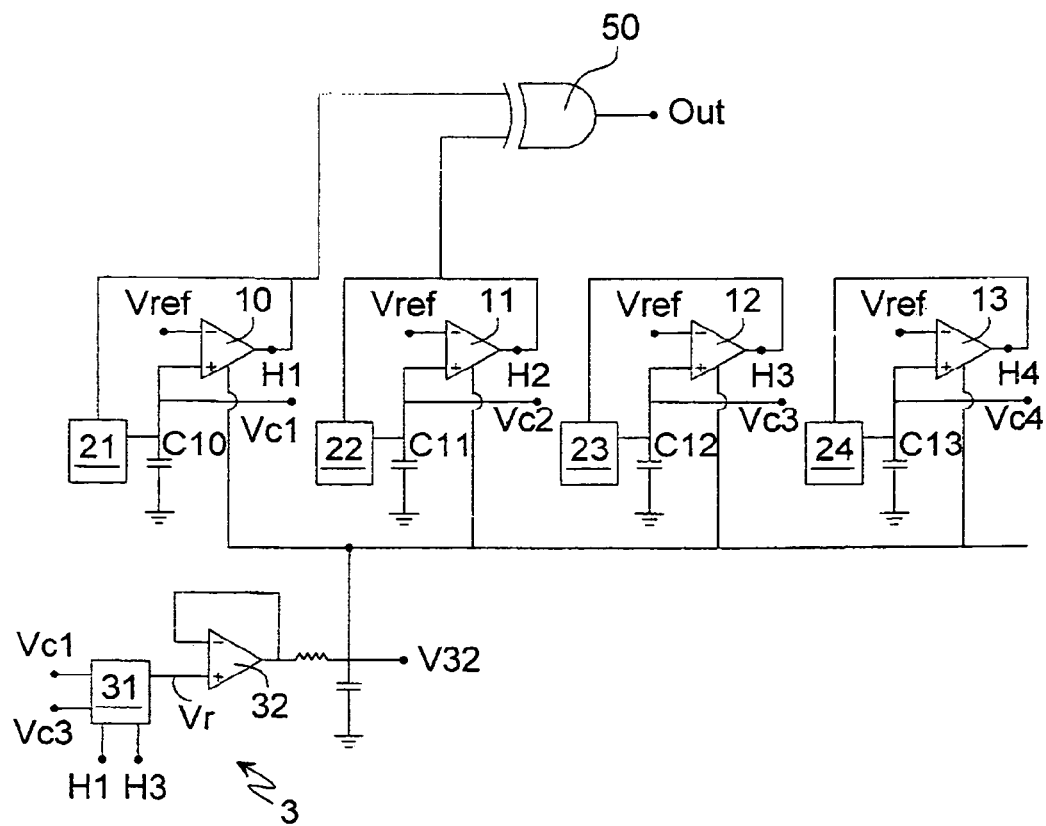
FIG. 4 is a diagram of an exemplary circuit implementation of the oscillator of FIG. 3.

In one exemplary embodiment, the oscillator has a four-phase structure and produces a square-wave signal at output, as shown in FIG. 4. The oscillator of this embodiment comprises four capacitors C10-C13, four respective comparators 10-13, and four respective devices 21-24 for charging or discharging the respective capacitors C10-C13. The capacitors C10-C13 each have one terminal connected to ground and the other terminal connected to the non-inverting terminal of the respective comparator 10-13, whose inverting terminal receives a reference voltage Vref. The comparators 10-13 each compare the voltage Vc1-Vc4 on the respective capacitor C10-C 13 with the reference voltage Vref and activate, through the respective output signal H1-H4, the device 21-24 so as to command the charging or the discharging of the respective capacitor C10-C13. More precisely when one of the voltages Vc1-Vc4 equals the voltage Vref the respective comparator 10-13 commands the discharging of the respective capacitor C10-C13, while when one of the voltages Vc1-Vc4 tends to zero the respective comparator 10-13 commands the charging of the respective capacitor C10-C13. The output Out of the oscillator is the output signal of an exclusive gate OR 50 that receives the signals H1 and H2 at its inputs.

Figure 5:
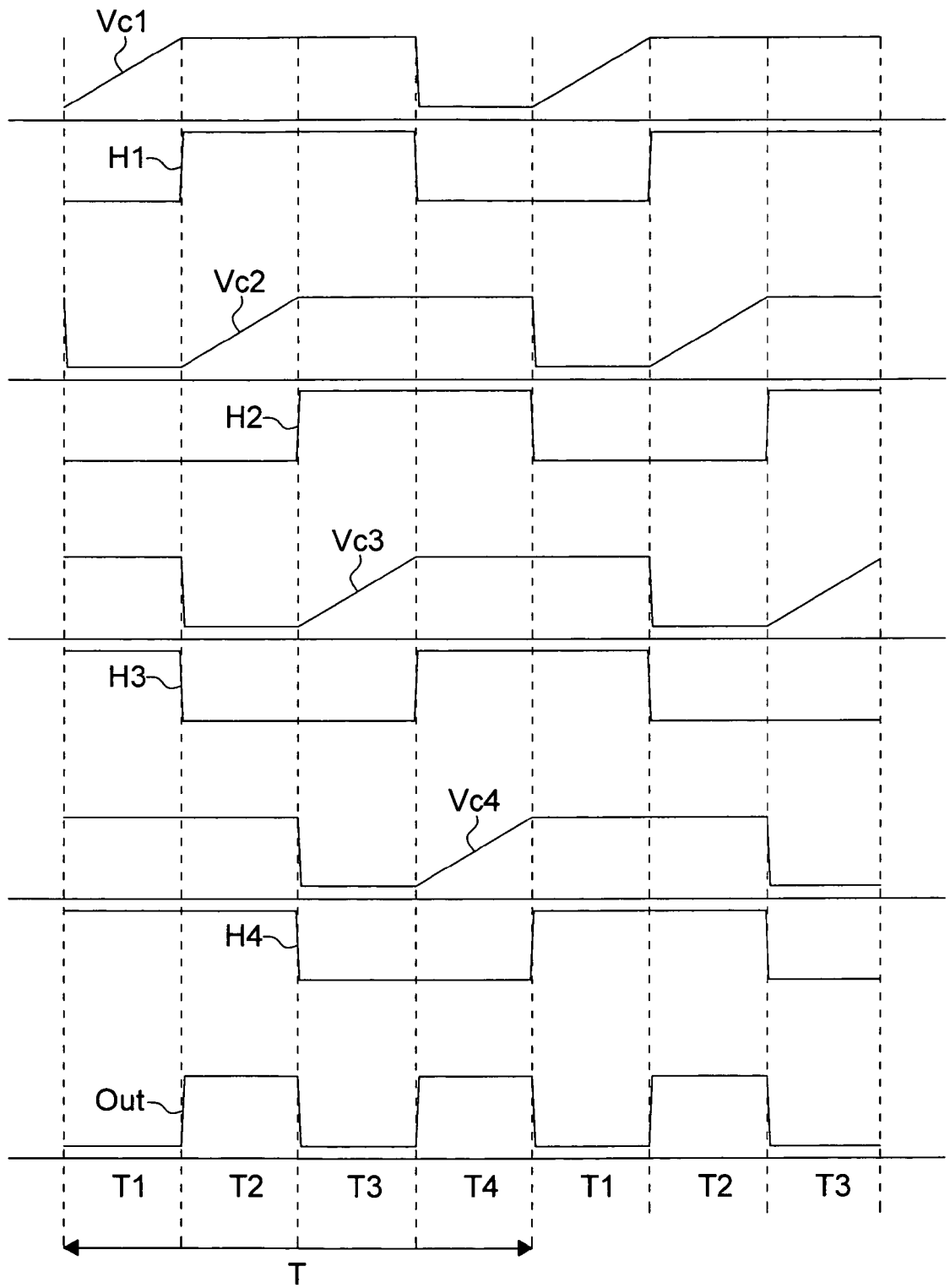
FIG. 5 shows a graph of the signals output from several elements of the circuit of FIG. 4.

In the oscillator of FIG. 4 the devices 21-24 are commanded to charge the respective capacitors C10-C13 in four distinct phases for each cycle. That is each complete oscillation cycle T comprises four successive periods of time T1-T4, preferably equal to each other, to which the respective charging phase of the capacitors C10-C13 corresponds, as shown in FIG. 5. As can be seen in the graph of FIG. 5, each of the voltages Vc1-Vc4 keeps the maximum value for two periods of time subsequent to the period of time of the charge. For example the voltage Vc1 reaches the maximum value at the end of the period of time T1 and keeps the maximum value for the successive periods of time T2 and T3, while in the period of time T4 zero is reached rapidly for the phase of discharging the associated capacitor C10. Each of the other voltages Vc2-Vc4 has a time path similar to the voltage Vc1.

The charge of the capacitors comes about sequentially. That is, the charging of each capacitor comes about when the previous capacitor in the sequence of capacitors has completed its charging. In the apparatus of FIG. 4 the charging of the capacitor C10 comes about when the capacitor C13 has completed its charging, the charging of the capacitor C11 comes about when the capacitor C10 has completed its charging, and so on.

The discharging of each capacitor comes about after two successive periods of time T1-T4 starting from when the capacitor has reached its maximum value. In FIG. 5 there can also be seen the signals H1-H4 output from the comparators 10-13; the signals remain at the maximum value for two periods of time of the periods of time T1-T4 that are successive to the period of time of the charging of the respective capacitor C10-C13.

In FIG. 5 there can also be seen the square wave signal output from the oscillator Out, whose frequency is equal to the inverse of the semiperiod T/2; in turn the semiperiod of the oscillating frequency is equal to the product given from the value of the capacitor by the voltage Vref divided by the current that circulates in the same capacitor.

In the oscillator of FIG. 4 the circuit 3 processes the offset voltage Voff starting from the voltages Vc1 or Vc3 at its inputs. The circuit 3 comprises a multiplexer 31 for selecting the voltage Vc1 or the voltage Vc3 when they are at the maximum value, an operational amplifier 32 with its output connected to the inverting terminal, and the series of a resistor and a capacitor connected between the output of the amplifier 32 and ground. The multiplexer 31 also preferably receives the signals H1 and H3 and has its output connected to the non-inverting terminal of the amplifier 32. The multiplexer 31 works so that when the signal H1 is high, the signal Vc1 will be present, while when the signal H3 is high the signal Vc3 will be present. In this way the voltage Vr present on the non-inverting terminal of the amplifier 32 is given by the reference voltage Vref added to the voltage Voff proportional to the time of delay Δt.

Therefore we have the voltage V32 on the output terminal of the operational amplifier 32, given by V32=K*(Vref+Voff), where K is the gain of the follower structure made up of the amplifier 32 with the inverting terminal connected to the output and the filter made up of the resistor and by the capacitor (normally the gain is K=1). The voltage V32 is used by the comparators 10-13 to generate an offset of voltage on the non-inverting terminal equal to the difference between the voltage V32 and the voltage supplied to the inverting terminal Vref.

In a real comparator the switching comes about with a delay Δt. Therefore, considering one of the comparators 10-13, one real comparator 10-13 can be considered like an ideal comparator, that is with nil switching time, if at its inverting terminal we consider the application of a voltage given by Vref+Voff. If at the non-inverting terminal the voltage on the capacitor is added to the voltage V32−Vref we have the switching of the comparator 10, for example, coming about when Vc1+(V32−Vref)=Vref+Voff, that is when Vc1=Vref. Therefore there is the annulment of the switching time of the comparator 10. The effect is to have diminished the voltage Vref applied at the inverting terminal of a real comparator by a preset value Voff, which is proportional to the switching time Δt, so as to anticipate the switching of the same comparator so that the switching comes about when Vref=Vc1 eliminating the delay of the real comparator 10.

Figure 6:
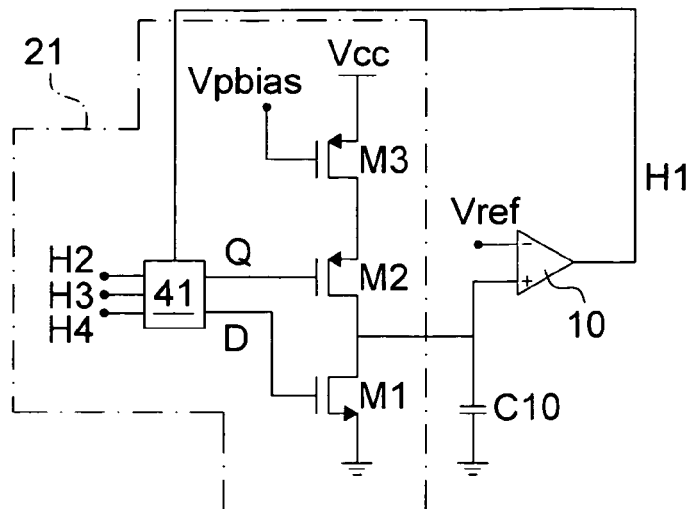
FIG. 6 is a circuit diagram of an element of the circuit of FIG. 4 according to one embodiment of the present invention.

FIG. 6 shows one of the devices for charging or discharging a capacitor in detail in accordance with one embodiment of the present invention. By way of example, device 21 for charging or discharging the capacitor C10 is shown. The device 21 comprises a logic circuit 41 that receives the outputs H1-H4 of all the comparators 10-13 and supplies two signals Q and D at the output to determine the charging and the discharging of the capacitor according to whether the value of the signal H1 is low or high. The device 21 also comprises an NMOS transistor M1 and a PMOS transistor M2 driven respectively by the signals Q and D produced by the logic circuit 41. Another PMOS transistor M3 has its gate terminal connected to a bias voltage Vpbias and has its drain terminal connected to the drain terminal of the transistor M2 and its source terminal connected to the supply voltage Vcc. For discharging the capacitor C10, the signal D is such that it turns on the transistor M1 while the signal Q turns off the transistor M2. During the charging phase, the signal Q is such that it turns on the transistor M2 to enable the charging at the voltage Vcc and the signal D is such that it turns off the transistor M1.

Figure 7:
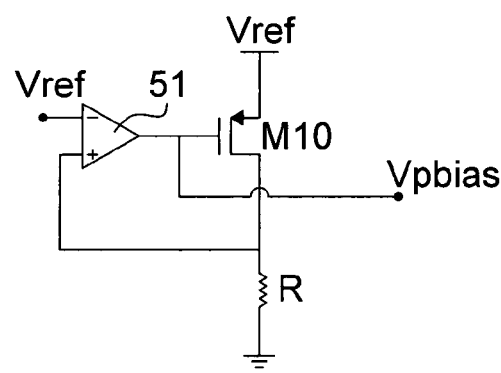
FIG. 7 is a circuit diagram of an element for the generation of a bias voltage needed by the circuit of FIG. 3 according to one embodiment of the present invention.

FIG. 7 shows a circuit capable of generating the bias voltage Vpbias according to one embodiment of the present invention. The circuit comprises an operational amplifier 51 having its non-inverting input terminal connected to the reference voltage Vref while its inverting terminal is connected to the drain of a PMOS transistor M10 and to a resistor R, which has its other terminal connected to ground. The gate terminal of the transistor M10 is connected to the output of the amplifier 51 while the source terminal is connected with the reference voltage Vref, the output of the amplifier 51 supplies the voltage Vpbias.

Figure 8:
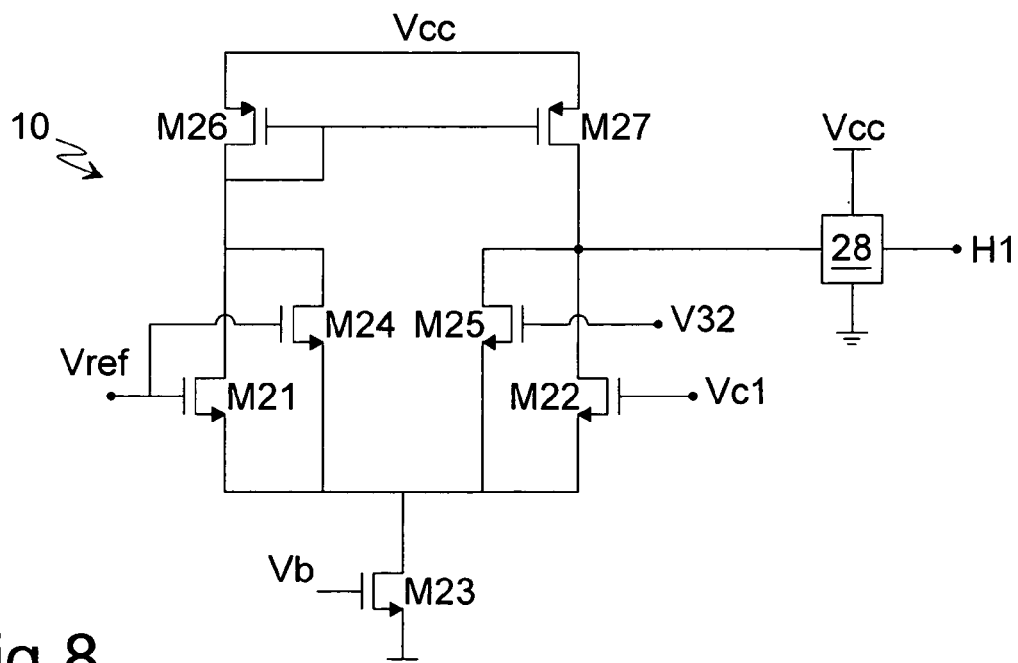
FIG. 8 is a circuit diagram of a comparator used in the circuit of FIG. 3 according to one embodiment of the present invention.

FIG. 8 shows a circuit implementation of one of the comparators according to one embodiment of the present invention. By way of example, the comparator 10 is shown. The comparator 10 comprises a differential stage M21-M22 closed by a current mirror M26 and M27. The NMOS transistors M21 and M22 have their source terminals in common connected to the drain terminal of an NMOS transistor M23, which has its gate terminal connected to the voltage Vb. The gate terminal of the transistor M21 is connected to the reference voltage Vref while the gate terminal of the transistor M22 is connected to the voltage Vc1. A transistor M24 having its terminals connected like the transistor M21 permits a double value current on the drain terminal in common, while a transistor M25 having its source and drain terminals connected with the source and drain terminals of the transistor M22 has its gate terminal connected to the voltage V32. In this way, on the node P there will be an offset voltage given by the voltage V32-Vref. The voltage present on the drain terminal of the transistors M22, M25 and M27 is inverted by a circuit block 28 to produce the output voltage signal H1.

Another method for obtaining the device 3 is through the use of two operational amplifiers with their inverting inputs connected to their outputs and having their non-inverting inputs connected to the voltage Vc1 and to the voltage Vc3 and being enabled by the two signals H1 and H3. There will thus be the alternated operation of one or the other amplifier during the operation of the oscillator.

The application of a voltage Voff to the comparators permits the dynamic adjustment, according to the working conditions and the process variables; the anticipation of the switching of the comparators adjusts the delay to the response.

Figure 1:
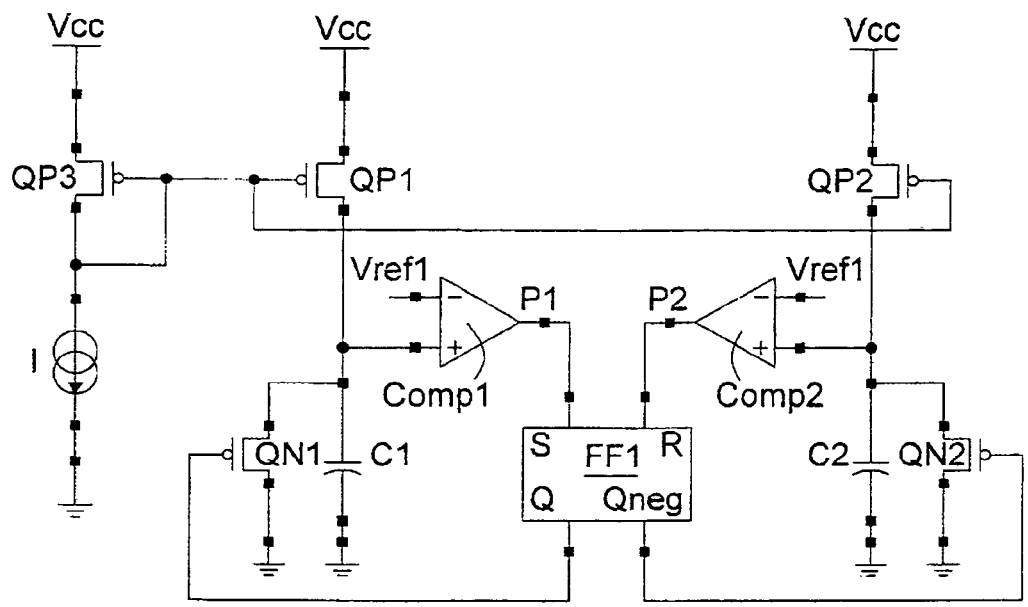
FIG. 1 is a circuit diagram of a conventional oscillator.
Figure 2:
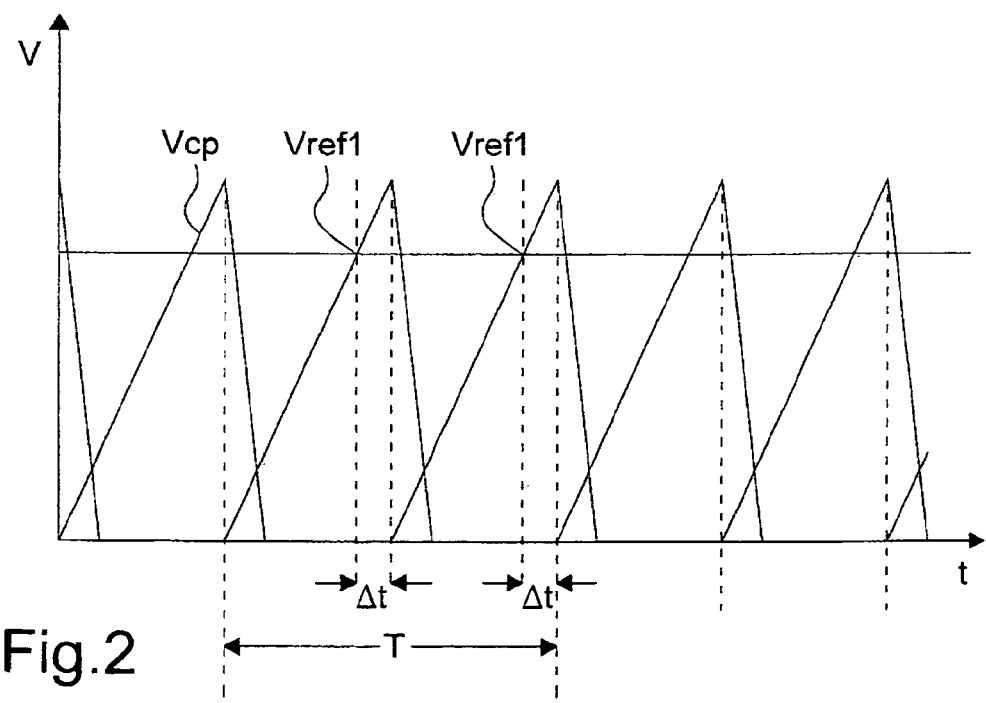
FIG. 2 is a graph of the time trend of the voltage in the capacitors of the conventional oscillator of FIG. 1.

From simulations carried out between the oscillators of FIG. 1 and FIG. 4 using a supply voltage Vcc=1.2 V and a reference voltage Vref1=Vref=0.6 V, we obtained the period of time Δt of 2 ns for the oscillator of FIG. 1 and 0.5 ns for the oscillator of FIG. 4. In addition we obtained a variation of voltage ΔV of 216 mV for the oscillator of FIG. 1 and 45 mV for the oscillator of FIG. 4.

While there has been illustrated and described what are presently considered to be the preferred embodiments of the present invention, it will be understood by those skilled in the art that various other modifications may be made, and equivalents may be substituted, without departing from the true scope of the present invention. Additionally, many modifications may be made to adapt a particular situation to the teachings of the present invention without departing from the central inventive concept described herein. Furthermore, an embodiment of the present invention may not include all of the features described above. Therefore, it is intended that the present invention not be limited to the particular embodiments disclosed, but that the invention include all embodiments falling within the scope of the appended claims.

What is claimed is:

1. An oscillator comprising:
   at least one capacitor;
   at least one device for charging or discharging the capacitor;
   at least one comparator coupled to the capacitor, the comparator comparing the voltage on the capacitor with a reference voltage and activating the device for charging or discharging the capacitor; and
   a circuit for supplying an offset voltage to the comparator at least when the device commands the charging of the capacitor, so that the comparator compares the reference voltage diminished by the offset voltage with the voltage on the capacitor, or compares the voltage on the capacitor added to the offset voltage with the reference voltage,
   wherein the circuit for supplying the offset voltage automatically generates the offset voltage based on a final value of the voltage on the capacitor.

2. The oscillator according to claim 1, wherein the offset voltage is proportional to a period of time that the comparator takes for switching.

3. An oscillator comprising:
   at least one capacitor;
   at least one device for charging or discharging the capacitor;
   at least one comparator coupled to the capacitor, the comparator comparing the voltage on the capacitor with a reference voltage and activating the device for charging or discharging the capacitor; and
   a circuit for supplying an offset voltage to the comparator at least when the device commands the charging of the capacitor, so that the comparator compares the reference voltage diminished by the offset voltage with the voltage on the capacitor, or compares the voltage on the capacitor added to the offset voltage with the reference voltage,
   wherein the at least one capacitor comprises four capacitors,
   the at least one comparator comprises four comparators, each of the four comparators being coupled to an associated one of the four capacitors, and
   the at least one device for charging or discharging the capacitor comprises four devices, each of the four devices being coupled to an associated one of the four capacitors.

4. The oscillator according to claim 3, wherein the four devices operate so as to charge the four capacitors in sequence one after the other in four distinct periods of time whose sum is the period of oscillation.

5. The oscillator according to claim 4, wherein each of the four devices keeps the voltage on the associated capacitor at the maximum value for two successive periods of the four periods of time, the two successive periods being those immediately after the period of time in which the associated capacitor was charged.

6. The oscillator according to claim 5, wherein the circuit for supplying the offset voltage generates the offset voltage based on the voltages on the first and third capacitors of the sequence of the four capacitors.

7. An oscillator comprising:
   at least one capacitor;
   at least one first means for charging or discharging the capacitor;
   at least one comparator coupled to the capacitor, the comparator comparing the voltage on the capacitor with a reference voltage and activating the first means for charging or discharging the capacitor; and
   second means for supplying an offset voltage to the comparator at least when the first means charges the capacitor, so that the comparator compares the reference voltage diminished by the offset voltage with the voltage on the capacitor, or compares the voltage on the capacitor added to the offset voltage with the reference voltage,
   wherein the second means automatically generates the offset voltage based on a final value of the voltage on the capacitor.

8. The oscillator according to claim 7, wherein the offset voltage is proportional to a period of time that the comparator takes for switching.

9. The oscillator according to claim 7,
   wherein the at least one capacitor comprises four capacitors,
   the at least one comparator comprises four comparators, each of the four comparators being coupled to an associated one of the four capacitors, and
   the at least one first means comprises four first means, each of the four first means being coupled to an associated one of the four capacitors.

10. The oscillator according to claim 9, wherein the four first means operate so as to charge the four capacitors in sequence one after the other in four distinct periods of time whose sum is the period of oscillation.

11. The oscillator according to claim 10, wherein each of the four first means keeps the voltage on the associated capacitor at the maximum value for two successive periods of the four periods of time, the two successive periods being those immediately after the period of time in which the associated capacitor was charged.

12. The oscillator according to claim 11, wherein the second means generates the offset voltage based on the voltages on the first and third capacitors of the sequence of the four capacitors.

13. A method for operating an oscillator that includes at least one capacitor, at least one comparator coupled to the capacitor, and at least one device for charging or discharging the capacitor, the method comprising the steps of:
   supplying a reference voltage to the comparator;
   supplying an offset voltage to the comparator;
   comparing the voltage on the capacitor and the reference voltage such that the reference voltage diminished by the offset voltage is compared with the voltage on the capacitor, or such that the voltage on the capacitor added to the offset voltage is compared with the reference voltage; and
   commanding the charging of the capacitor,
   wherein the step of supplying the offset voltage comprises automatically generating the offset voltage based on a final value of the voltage on the capacitor.

14. The method according to claim 13, further comprising the step of determining a value of the offset voltage based on the period of time that the comparator takes for switching.

15. The method according to claim 13, wherein the step of supplying the offset voltage occurs before the comparing step so that in the comparing step the reference voltage diminished by the offset voltage is compared with the voltage on the capacitor, or the voltage on the capacitor added to the offset voltage is compared with the reference voltage.

16. A method for operating an oscillator that includes at least one capacitor, at least one comparator coupled to the capacitor, and at least one device for charging or discharging the capacitor, the method comprising the steps of:
   supplying a reference voltage to the comparator;
   supplying an offset voltage to the comparator;

comparing the voltage on the capacitor and the reference voltage such that the reference voltage diminished by the offset voltage is compared with the voltage on the capacitor, or such that the voltage on the capacitor added to the offset voltage is compared with the reference voltage; and commanding the charging of the capacitor, wherein the oscillator includes four capacitors, and the commanding step comprises charging the four capacitors in sequence one after the other in four distinct periods of time whose sum is the period of oscillation.

17. The method according to claim 16, further comprising the step of keeping the voltage on each capacitor at the maximum value for two successive periods of the four periods of time, the two successive periods being those immediately after the period of time in which that capacitor was charged.

18. The method according to claim 17, wherein the step of supplying the offset voltage comprises generating the offset voltage based on the voltages on the first and third capacitors of the sequence of the four capacitors.

19. The oscillator according to claim 1, wherein the circuit for supplying the offset voltage includes an operational amplifier, the voltage on the capacitor is coupled to an input of the operational amplifier, and an output of the operational amplifier is coupled to the output of the circuit for supplying the offset voltage.

20. The oscillator according to claim 1, wherein when the device charges the capacitor, the comparator deactivates the device at an earlier time based on the offset voltage.

* * * * *